United States Patent [19]

Hohimer et al.

[11] Patent Number: 5,349,601
[45] Date of Patent: Sep. 20, 1994

[54] UNIDIRECTIONAL RING LASERS

[75] Inventors: John P. Hohimer; David C. Craft, both of Albuquerque, N. Mex.

[73] Assignee: The United States of America as represented by the United States Department of Energy, Washington, D.C.

[21] Appl. No.: 123,835

[22] Filed: Sep. 20, 1993

[51] Int. Cl.⁵ .............................................. H01S 3/083
[52] U.S. Cl. ......................................... 372/94; 372/6; 385/39
[58] Field of Search ................ 372/94, 6; 385/39, 42, 385/45-47

[56] References Cited

U.S. PATENT DOCUMENTS

| 4,924,476 | 5/1990 | Behfar-Rad et al. | 372/94 |
| 5,031,190 | 7/1991 | Behfar-Rad | 372/94 |
| 5,177,764 | 1/1993 | Nilsson | 372/94 |

FOREIGN PATENT DOCUMENTS

| 0172286 | 9/1984 | Japan | 372/94 |
| 0073788 | 4/1987 | Japan | 372/94 |
| 0006081 | 1/1991 | Japan | 372/94 |
| 0132284 | 5/1992 | Japan | 372/94 |
| 0121801 | 5/1993 | Japan | 372/94 |

OTHER PUBLICATIONS

Y. H. Ja, "A Spectacles-Shaped Optical Fibre Ring Resonator with Two Couplers," Optical and Quantum Electronics 23 (1991) pp. 379-389.

Y. H. Ja, "Simultaneous Resonance of an S-Shaped Two-Coupler Optical Fibre Ring Resonator," Optics Communications 102 (1993) pp. 133-140.

Y. H. Ja, "An Unsymmetric S-Shaped Double-Coupler Optical Fibre Loop," Optics Communications, vol. 78, No. 1, (Aug,. 1990), pp. 81-89.

Y. H. Ja, "A Symmetric S-Shaped Double-Coupler Optical-Fibre Loop," Journal of Modern Optics, (1990), vol. 37, No. 8, pp. 1297-1317.

Primary Examiner—Georgia Y. Epps
Attorney, Agent, or Firm—Gregory A. Cone

[57] ABSTRACT

Unidirectional ring lasers formed by integrating nonreciprocal optical elements into the resonant ring cavity. These optical elements either attenuate light traveling in a nonpreferred direction or amplify light traveling in a preferred direction. In one preferred embodiment the resonant cavity takes the form of a circle with an S-shaped crossover waveguide connected to two points on the interior of the cavity such that light traveling in a nonpreferred direction is diverted from the cavity into the crossover waveguide and reinjected out of the other end of the crossover waveguide into the cavity as light traveling in the preferred direction.

28 Claims, 12 Drawing Sheets

UNIDIRECTIONAL RING LASERS

The government has rights in this invention pursuant to Contract No. DE-AC04-76DP00789 awarded by the U.S. Department of Energy.

BACKGROUND OF THE INVENTION

Semiconductor diode lasers with a ring resonator are an alternative to linear-cavity (Fabry-Perot) lasers for photonic integrated circuits and other applications. A ring resonator utilizes total internal reflection in a circular ring structure thus eliminating the need for end-facet mirrors and allowing direct integration with waveguides, and other photonic integrated circuit components. Previous semiconductor ring diode lasers have operated in a bidirectional mode characterized by lasing in the two counterpropagating ring directions (clockwise and counterclockwise). This bidirectional mode of operation is undesirable for the following reasons: (1) the lasing power in the ring cavity is distributed between the two lasing ring directions so that only half of the total circulating laser power can be accessible to a single output waveguide when a branching Y-junction output coupler is used (the remaining half of the laser power is propagating around the ring cavity in a direction which is not coupled out at the Y-junction); (2) the lasing power in the non-output-coupled ring direction can actually be much larger than that in the output-coupled direction as a result of back-injection by a reflection of the output-coupled lasing at an end-facet mirror at the termination of the output waveguide or by back-reflections from other downstream photonic integrated circuit components (we have shown that such back-injection can reduce the power and slope efficiency of the output-coupled light by as much as an order of magnitude); and (3) bidirectional ring diode lasers exhibit modal instabilities and kinks in their light-vs-current characteristics due to strong coupling of the counterpropagating lasing modes through the semiconductor gain medium.

The attainment of unidirectional operation in a semiconductor ring diode laser would eliminate many of the undesirable characteristics of bidirectional ring diode lasers as discussed above. Since the majority of the lasing power in a unidirectional device would be in a single preferred ring direction, it would be more readily accessible to a single output-coupled waveguide, thereby leading to an increase in the output power. And since any reflection feedback would be coupled back into the ring cavity in the unsupported low-gain direction, it would have much less of an effect on the output-coupled lasing. Unidirectional operation will also improve the operating characteristics of ring laser sources for use in photonic integrated circuits and other applications by reducing noise and instabilities due to gain competition between counterpropagating lasing modes. This results in much more linear and kink-free light-vs-current characteristic in unidirectional ring diode lasers. And finally, the development of a monolithic unidirectional ring diode laser will lead to new applications based on the control and switchability of the direction of lasing in the ring. These applications include but are not limited to ring gyroscopes (in which a beat frequency between two oppositely-directed unidirectional ring diode lasers is detected to measure the rotation rate), optical logic elements (in which the direction of lasing in the ring is the logic state of the device; and this direction is electrically controlled and switched), optical signal routing elements for photonic integrated circuits (in which the signals are routed around a ring cavity with multiple outputs which can be selected by electrically or optically controlling the ring direction and other electrically switchable components such as output-couplers and waveguides and other optoelectronic elements as may be required).

The attainment of unidirectional lasing has long been a goal in the development of ring diode lasers. Unidirectional lasing in a ring laser cavity requires the use of a nonreciprocal gain or loss (attenuation) mechanism which favors one direction of propagation of the lasing light over another. Previously, the mechanisms proposed for achieving unidirectional lasing in ring diode lasers have been based either on reflection from a cleaved end-facet mirror or on injection locking by a source of lasing radiation external to the ring cavity. The previous reflection schemes relied on the angular-dependent reflection from the cleaved- or etched-facet output mirror in a triangular or polygonal ring diode laser, or on the back-reflection from a cleaved-facet mirror located at the termination of one of the output waveguides of a circular or square ring diode laser. The laser radiation for the injection locking scheme was injected into the ring at a partially transmitting etched-facet ring cavity mirror. The source for injection locking was either another laser or else the lasing output from the ring laser itself, in which case an external etched-facet mirror was used to reflect a part of the lasing output back into the ring cavity in a preferred direction of propagation.

The common requirement of all the previous schemes for unidirectional lasing as presented above is the need for etched- or cleaved-facet mirrors. The requirement for these mirrors complicates the fabrication of these devices and limits their reliability due to the exposed facet which must be coated to protect it from the environment. These facet mirrors also prevent the unidirectional ring diode laser from being directly coupled into other waveguides as for the fabrication of a photonic integrated circuit. These previous devices must instead be air-gap coupled which is less desirable since it introduces transmission and coupling losses and is very sensitive to fabrication tolerances (the air-gap spacing must be precisely controlled since this air gap forms an additional resonant cavity).

SUMMARY OF THE INVENTION

Herein we show the use of two new schemes which can be used singly or in combination for the purpose of generating unidirectional lasing in a semiconductor ring diode laser in a single preferred direction of propagation. These schemes are: (1) the incorporation of a nonreciprocal loss (attenuation) mechanism into the ting cavity (in the form of multiple branching-waveguide Y-junctions, flared optical waveguides, or other means known to the art); and (2) the incorporation of a nonreciprocal gain mechanism into the ring cavity (in the form of an active or passive crossover optical waveguide, which diverts the lasing from one ring direction, amplifies it, phase-shifts it to match the ring cavity phase condition, and injects it back into the ring in the opposite preferred ring direction). Some embodiments of the unidirectional ring diode laser in the present invention combine both of the above nonreciprocal mechanisms to form of a direct-waveguide-coupled laser source without the need for any etched- or cleaved-facet mirrors. The active crossover waveguide in our invention has the same p-n heterostructure epitaxial layer structure semiconductor gain medium as the ring diode laser so that it can be operated in a forward biased mode to amplify and phase shift the lasing coupled out of one ring direction of propagation and inject it back into the ring cavity in the opposite (preferred) direction of propagation. In our invention, over 95% of the ring lasing output is emitted in the preferred direction of propagation. We have applied our invention to several types of circular and racetrack ring cavities based on curved optical waveguides. However, the teaching of our invention is also applicable to other ting geometries, including but not limited to polygonal ring cavities formed from linear waveguide segments with etched, cleaved, or otherwise formed partially or totally reflecting mirrors. The teaching of our invention is also applicable to other types of lasers including but not limited to optical fiber lasers and optical waveguide lasers.

DETAILED DESCRIPTION OF THE INVENTION

Figure 1:
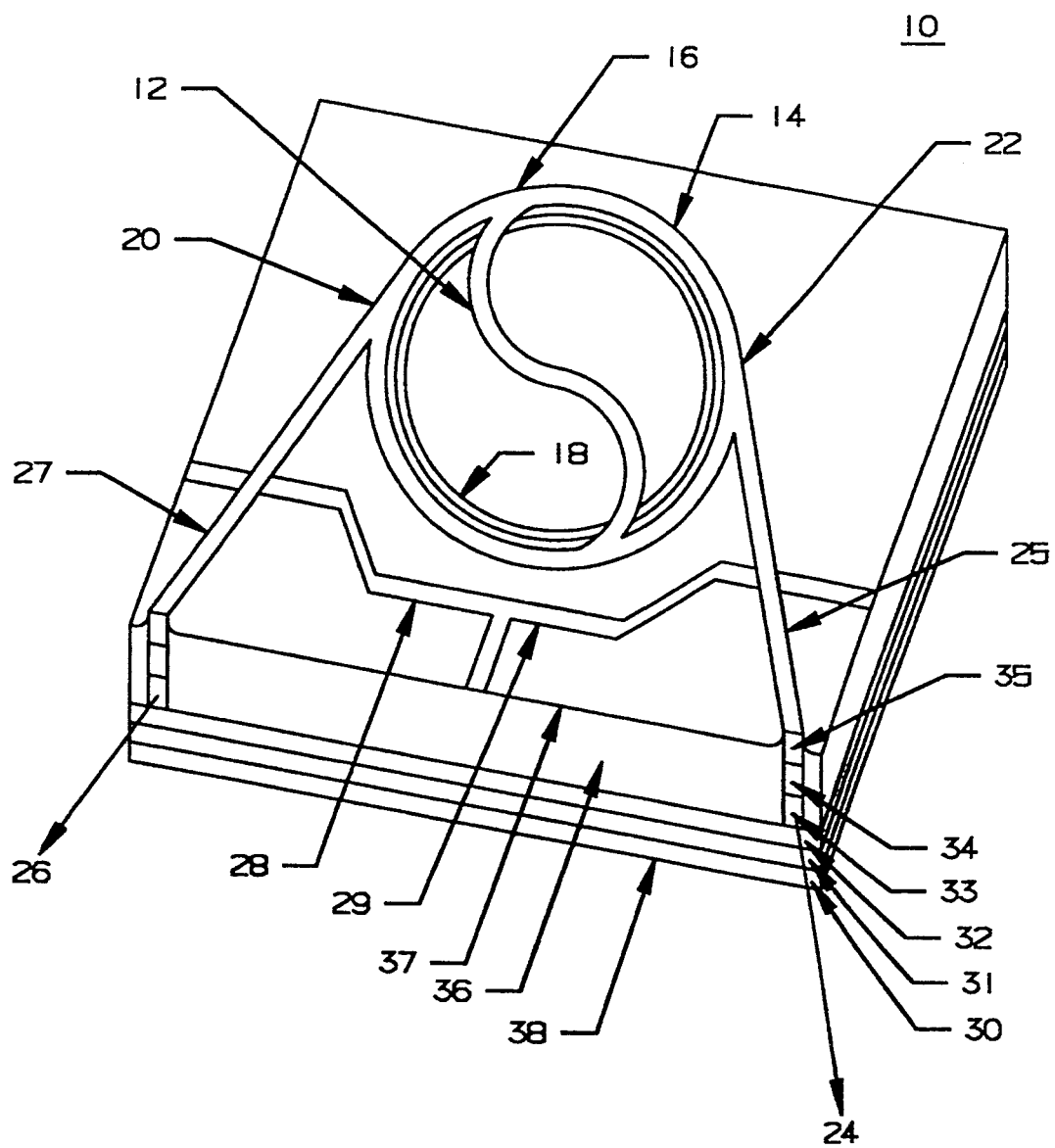
FIG. 1 is an isometric view of one embodiment of the invention with a circular resonant cavity with an S-shaped crossover waveguide.

FIG. 1 shows a schematic drawing of the first embodiment of our invention. Referring to FIG. 1, this embodiment of the invention is shown as a circular ring cavity semiconductor diode laser device 10 incorporating a single crossover optical waveguide in the form of an S-shaped waveguide 12. The circular polyimide-embedded rib-waveguide ring diode laser cavity 14 has a radius of 200 microns and a waveguide width of 6 microns, for example, although other dimensions for the ring radius and waveguide width can be used as known to those skilled in the art. Inside the ring cavity is located an equal-width crossover S-waveguide with a bend radius half that of the ring (100 micron S-waveguide bend radius in the present example) and direct-coupled to the ring cavity by means of two branching-waveguide Y-junctions 16. The two branching-waveguide Y-junctions are both oriented in the same direction to couple part of the counterclockwise lasing from the ring and thereby introduce a nonreciprocal attenuation in the ring cavity in the counterclockwise direction. An electrical current can be applied to the S-waveguide to forward bias it independent of the ring diode laser by means of a break 18 in the upper p-side contact metallization inside the ring (see FIG. 1). When the S-waveguide is forward biased the light coupled out of the ring cavity in the counterclockwise ring direction is amplified, phase shifted, and injected back into the ring diode laser cavity in the opposite (clockwise) ring direction. Subject to phase and mode matching conditions, this injected light reinforces the lasing mode in the ring cavity in the preferred (clockwise) direction and thereby adds a nonreciprocal gain component to the lasing medium in this direction of propagation. The nonreciprocity in attenuation and gain act together in an additive manner to increase the nonreciprocity and unidirectionality of the ring diode laser in the present invention. Although the preferred direction for unidirectional lasing in FIG. 1 (and in all the other embodiments of the present invention) is shown as the clockwise ring direction, it is understood that the geometry of the crossover waveguide and associated branching waveguide Y-junctions can be reversed to favor unidirectional lasing in the counterclockwise ring direction. And for many applications of the invention (e.g. ring laser gyroscopes, rotation sensors, and optical logic and computing) a multiplicity of unidirectional ring diode lasers with opposite directions of propagation of the lasing may be co-located on a single semiconductor substrate with the directions of propagation either fixed or electrically switchable.

Figure 7:
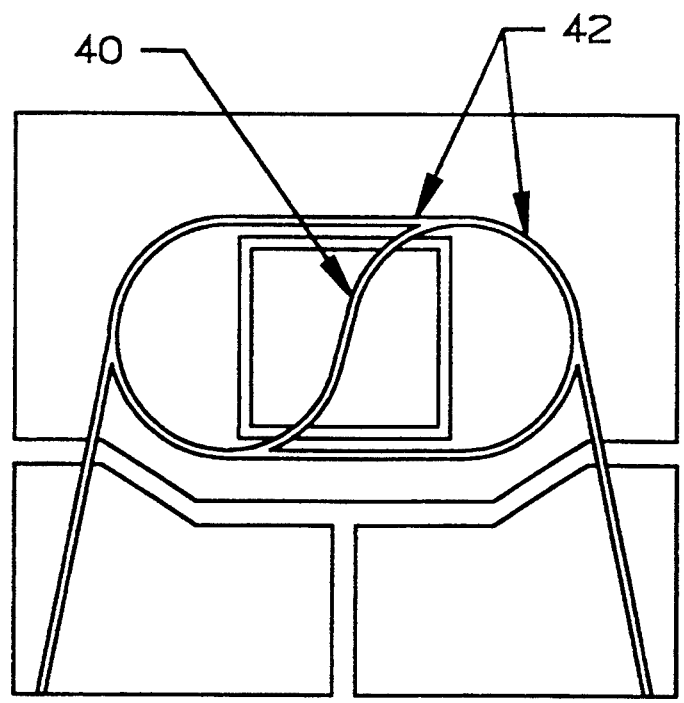
FIG. 7(a) is a second embodiment of the invention shown in plan view in which the closed loop resonant portion of the device is in the form of a racetrack with two semicircular ends joined by two linear segments with the output waveguides branching off from the semicircular ends.
FIG. 7(b) is a third embodiment which differs from the embodiment of FIG. 7(a) in that the output waveguides branch off from the linear segments.
Figure 7:
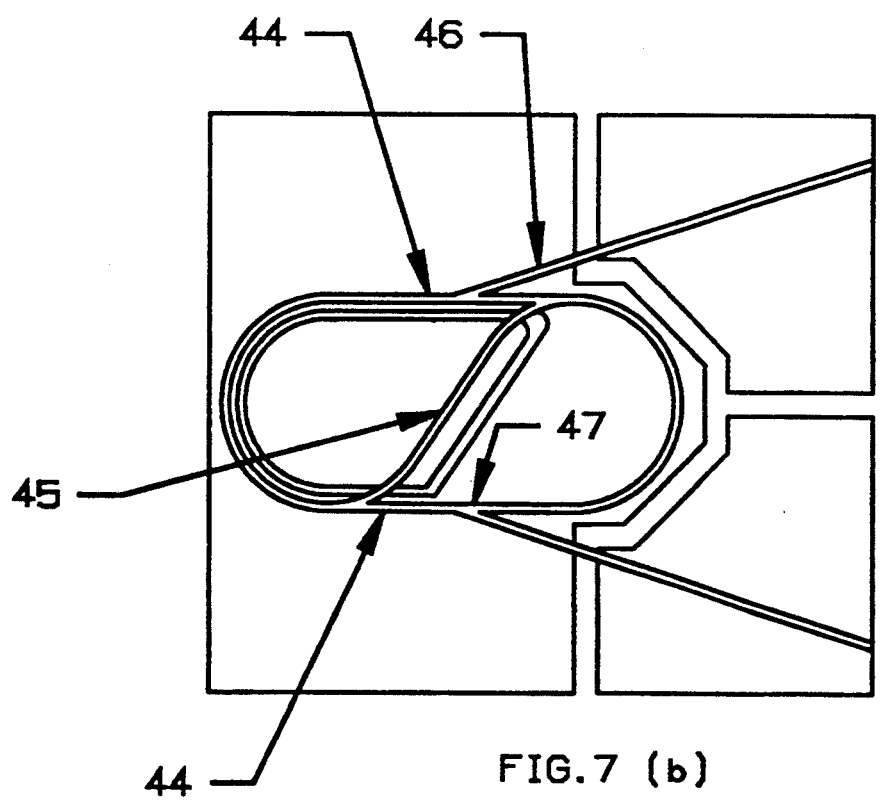
Figure 10:
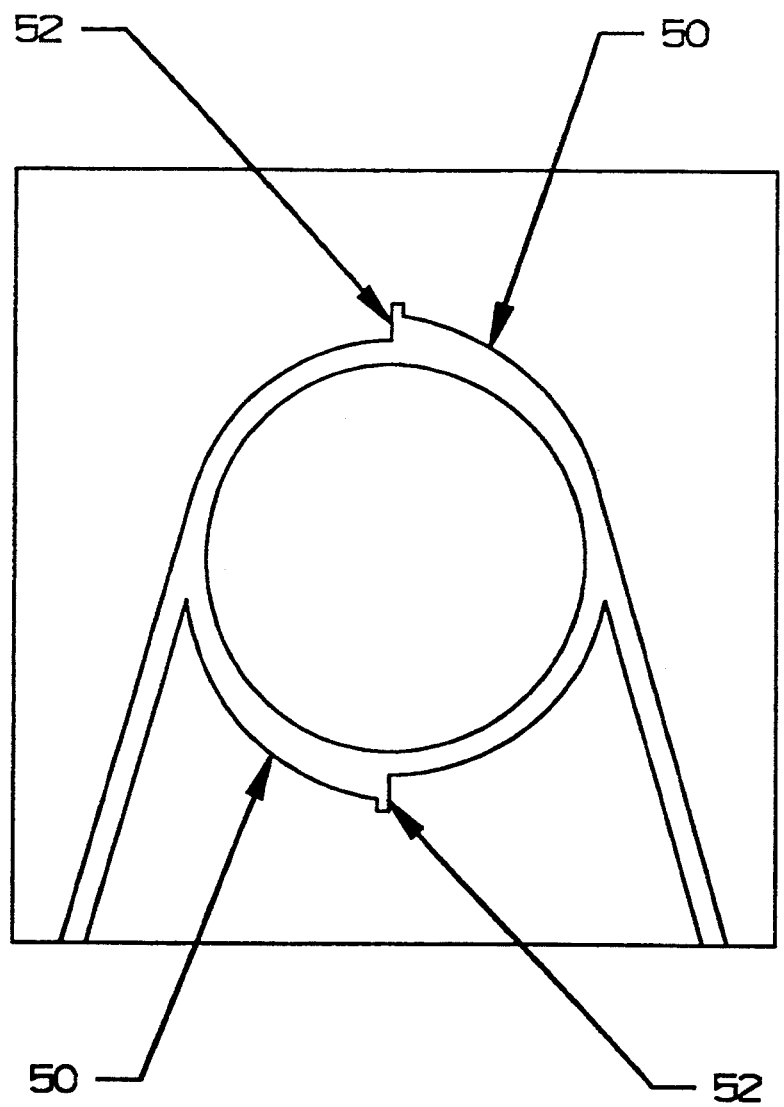
FIG. 10 is a plan view of a fourth embodiment of the invention taking the form of a flared-waveguide semiconductor ring diode with etched-facet back-reflection mirrors at the flared-waveguide terminations.

In the first embodiment of the present invention in FIG. 1, two additional branching waveguide Y-junction output couplers 20 and 22 are used to form the clockwise 24 and counterclockwise 26 ring laser outputs. Each output is coupled into an equal-width (6 microns wide) linear waveguide 25 and 27. These output waveguides have been tilted by $\pm 10°$ with respect to the normal to their cleaved end-facet terminations to prevent any back reflection into the ring. This waveguide tilt angle was used as a precaution in the present devices to allow an unbiased measure of the unidirectional operation of the device and is not a requirement for the invention (especially for photonic integrated circuit applications where any back reflection will be much smaller than that of the semiconductor-air interface). In addition, these output waveguides in FIG. 1 (and also in FIG. 7) are segmented with breaks 28 and 29 in the upper (p-side) contact metallization to allow 200-micron-long waveguide sections to be reverse biased for use as integrated waveguide photodetectors or forward biased for use as waveguide amplifiers. This segmentation of the output waveguides is not essential to the present invention but may prove useful for many applications of the invention to detect, amplify, phase shift, modulate, or otherwise act upon the lasing output from the unidirectional ring diode laser. The embodiments of the invention in FIGS. 1, 7, and 10 are shown with two output waveguides for the clockwise and counterclockwise ring outputs. However, the number and locations of the output waveguides is not restricted as shown in these figures. In some cases, one or more output waveguides may be used only for the preferred direction of lasing; or multiple ring outputs in one or the other or both ring directions may be used as required without affecting the essential features of the invention.

In the disclosed invention, the epitaxial layer structure for the unidirectional ring diode lasers is of conventional GaAs/AlGaAs single-quantum-well graded-index separate-confinement-heterostructure (GRIN-SCH) design grown by conventionally known methods. A preferred method for growing a single-quantum-well GRIN-SCH semiconductor wafer for the fabrication of the unidirectional ring diode laser in the present invention is by metal-organic chemical vapor deposition (MOCVD) on a (100)-oriented, Si-doped ($1 \times 10^{18}$ cm$^{-3}$) n-type GaAs substrate 30. In this method, a 1.0-micron GaAs:Se ($1 \times 10^{18}$ cm$^{-3}$) n-type buffer layer 31 is initially grown followed by a 1.5-micron Al$_{0.6}$Ga$_{0.4}$As:Se ($5 \times 10^{17}$ cm$^{-3}$) n-type optical confinement layer 32; an undoped active region 33 consisting of a 0.2-micron Al$_x$Ga$_{1-x}$As linearly graded ($x=0.6-0.3$) layer, a single 100 angstrom GaAs quantum well, and a 0.2-micron Al$_x$Ga$_{1-x}$As linearly graded ($x=0.3-0.6$) layer; a 1.5-micron Al$_{0.6}$Ga$_{0.4}$As:Zn ($8 \times 10^{17}$ cm$^3$) p-type optical confinement layer 34 and a 0.1-micron GaAs:Zn ($1 \times 10^{19}$ cm$^{-3}$) p-type surface cap layer 35. Other epitaxial growth techniques including molecular beam epitaxy (MBE) and liquid phase epitaxy (LPE), as well as other semiconductor material systems and other epitaxial layer structures are applicable to the present invention.

After growth of the epitaxial semiconductor wafer, a hard-baked photoresist pattern was used as an etch mask to form the rib-waveguide structure for the ring cavity and crossover and output waveguides in the epitaxially grown p-type semiconductor layers; and the patterned wafer was etched to a depth near or through the active layer (located at a depth of 1.6 microns) by chlorine reactive ion beam etching. (For devices with larger radii of curvature and hence lower bend losses or for polygonal devices with linear waveguide sections, the etch depth can be reduced to penetrate only the region of the upper cladding layer. For devices with etched-facet mirrors, such as the fourth embodiment of the invention in FIG. 10, it is desirable to increase the etch depth to partially or completely penetrate the lower cladding layer to obtain the maximum mirror reflectivities.) After the etch step, a full-surface polyimide insulating layer 36 was spun on, cured, and plasma etched to expose the surface cap layer of the rib waveguides for electrical contact. A patterned Ti/Au electrical upper contact metallization 37 was applied to the exposed p-type rib-waveguide surface of the wafer. The wafer was then mechanically polished to a thickness of approximately 100 microns; and a Au/Ge/Ni full-surface lower electrical contact metallization 38 was applied to the bottom of the n-type substrate and was thermally alloyed to form an ohmic contact.

Other methods well-known to the art can be used to form the waveguides and other elements in these unidirectional ring diode lasers. These methods include but are not limited to diffusion or ion-implantation disordering of multiple semiconducting epitaxial layers, regrowth of multiple semiconductor epitaxial layers, and other methods known to those skilled in the art. For some of these device fabrication methods (e.g. diffusion or ion-implantation layer disordering), a multi-quantum-well active region may be preferred to result in a larger refractive index discontinuity (step) in forming the optical waveguides to reduce the bend loss for curved waveguides (this bend loss in curved waveguides is reduced exponentially with increasing refractive index step).

The completed devices were probe tested junction-up (i.e. p-side up) on a temperature controlled (20° C.) silver heat sink at continuous-wave currents up to 200 mA. For operation at higher currents or for more efficient heat removal, the devices can be soldered junction-up on gold-plated copper heat sinks or other heat sink materials as known to those skilled in the art. For the device in FIG. 1, the lasing threshold current was 87 mA (960 A/cm$^2$).

Figure 2:
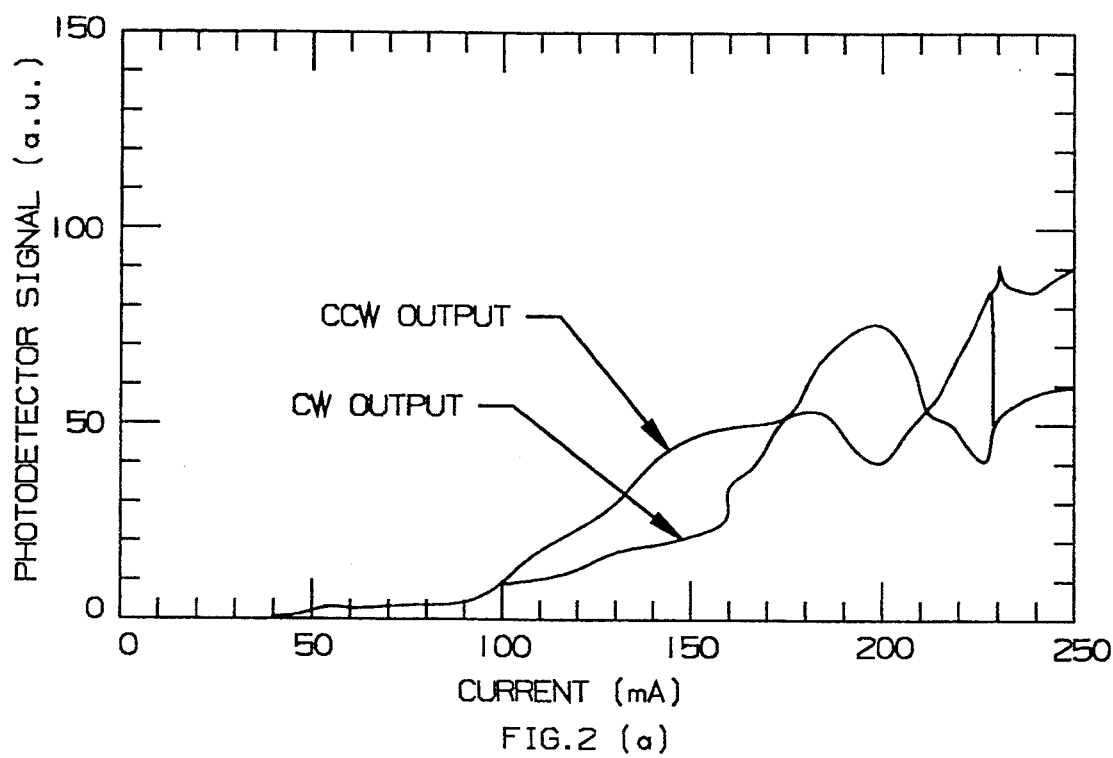
FIG. 2(a) is a graph showing continuous wave light vs, current curves in a bidirectional ring diode laser in both the clockwise (CW) and counterclockwise (CCW) directions.
FIG. 2(b) is a graph showing continuous wave light vs. current curves in a unidirectional ring laser diode with an S-shaped crossover waveguide forward biased at 0 and 50 mA current.
Figure 2:
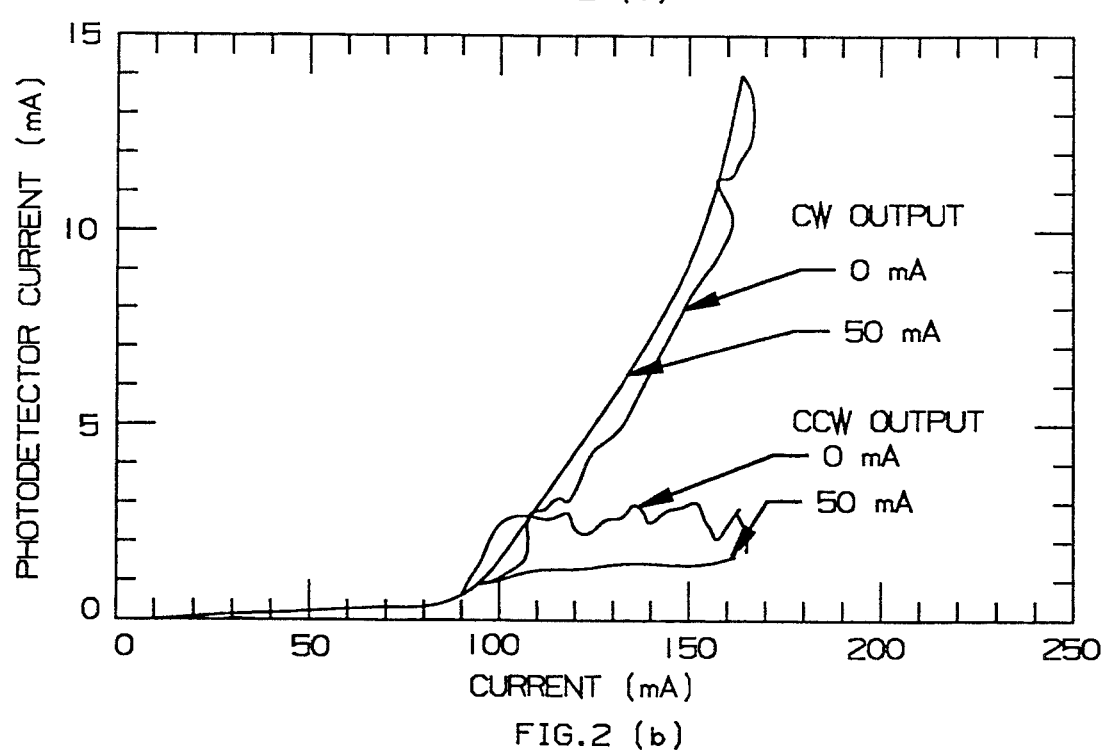

FIG. 2a shows for comparison the light-vs-current characteristic of one of our previous bidirectional ring diode lasers. These light-vs-current curves were measured with the integrated photodetectors ($-4.0$ volts reverse bias) located on the extensions of the clockwise (CW) and counterclockwise (CCW) ring output waveguides. FIG. 2a shows that the output from these bidirectional semiconductor ring diode lasers is approximately equal in both ring directions with numerous abrupt changes in the light output (kinks) due to the strong coupling of the counterpropagating lasing modes in the semiconductor gain medium. This mode coupling is an undesirable feature of these bidirectional ring diode lasers since it results in a very nonlinear light-vs-current characteristic with large variations in the light output power from both ring outputs.

In FIG. 2b, the light-vs-current characteristics are shown for the first embodiment of the present invention. The ring diode laser in FIG. 2b operates unidirectionally with increased output power and a more linear and kink-free output. These light-vs-current curves were recorded similarly with integrated waveguide photodetectors (see FIG. 1) with −4.0 volts reverse bias and for the conditions of 0 and 50 mA forward bias current to the crossover S-waveguide.

With 0 mA bias current to the S-waveguide in FIG. 2b, there is a large difference in the output power from the clockwise and counterclockwise outputs as expected for unidirectional operation. The ring diode laser in FIG. 2b at a continuous-wave operating current of 150 mA has 6 times the output power in the preferred clockwise ring direction as compared to the unsupported counterclockwise ring direction. The large absorptivity of the S-waveguide in the unbiased (0 mA) state prevents any light from traversing the crossover waveguide and injecting the ring in the clockwise direction. Thus, the unidirectional lasing with 0 mA S-waveguide bias is due solely to the nonreciprocal attenuation in the ring cavity generated by the addition of the two inner branching-waveguide Y-junctions which act to couple the counterclockwise lasing out of the ring while allowing the clockwise lasing to propagate with lower attenuation around the ring cavity. This invention, therefore, teaches the use of a nonreciprocal attenuation mechanism for promoting unidirectional lasing in a semiconductor ring diode laser. This nonreciprocal attenuation mechanism can be applied to other types of ring lasers including but not limited to optical fiber ring lasers and optical waveguide ring lasers for unidirectional operation. The gain medium in these other types of lasers may be based on a solid-state medium doped with rare earth ionic species or other types of gain media as known to the art. In the fiber embodiment, the S-shaped crossover waveguide joins the resonant cavity via fiber splitters which act as Y-junctions.

In the present embodiment of the invention, this nonreciprocal attenuation is generated by multiple branching waveguide Y-junctions arranged in the same direction around the ring cavity. We envision the use of other means for generating the requisite nonreciprocal attenuation for unidirectional lasing in the ring cavity. These include but are not limited to the use of one or more etched-facet reflecting mirrors or regions of flared waveguides. The latter flared waveguide regions 50 (formed by increasing the ring waveguide width with rotation angle around a portion of the ring) can be used in combination with back-reflecting mirrors 52 (to generate a nonreciprocal gain component in the counterpropagating ring direction) as shown in the fourth embodiment of the invention in FIG. 10. These flared waveguide sections allow the passage of the lasing in one ring direction while impeding the passage of the lasing in the opposite direction. In combination with a back-reflection mirror 52 (which is etched as a part of the ring waveguide as shown in FIG. 10) the lasing in the unsupported ring direction is reflected back in the opposite (preferred) ring direction to enhance the unidirectional lasing in the ring cavity.

In FIG. 2b, with the crossover S-waveguide biased at 50 mA current, the ring lasing is further unbalanced by the addition of a nonreciprocal gain component in the clockwise ring direction. This nonreciprocal gain arises from the clockwise lasing which is coupled out of the ring cavity by the two inner branching-waveguide Y-junctions, amplified by the forward-biased semiconductor p-n heterojunction in the S-waveguide, and injected back into the ring cavity in the preferred (clockwise) ring direction. As a result of forward biasing the S-waveguide, the lasing output power in the unsupported counterclockwise ring direction is further reduced with the lasing power redirected to the preferred clockwise ring direction to increase the output power in this preferred direction of propagation. This also increases the degree of unidirectional operation of the device with the ratio of clockwise to counterclockwise lasing power at 150 mA ring current increasing from about 6:1 at 0 mA S-waveguide forward bias current to more than 10:1 at 50 mA S-waveguide forward bias current. (As will be shown later, this ratio for the lasing emission is as large as 19:1 when the emission is spectrally resolved to separate the non-lasing spontaneous emission power present in the light-vs-current curves in FIG. 2b.)

To provide a calibrated measurement of the unidirectional output power from the device in this first embodiment of the invention, we forward biased the independent electrical contact to the clockwise ring output waveguide section (which was used as the clockwise integrated photodetector to generate the light-vs-current curves in FIG. 2b) at 20 mA current. We then measured the lasing power exiting the device at the termination of the clockwise output waveguide with a calibrated Si photodetector (United Detector Technology, Model S380 Optometer). At 150 mA ring current, the continuous-wave unidirectional output power was 3.5 mW and the slope efficiency was 0.052 W/A.

Figure 3:
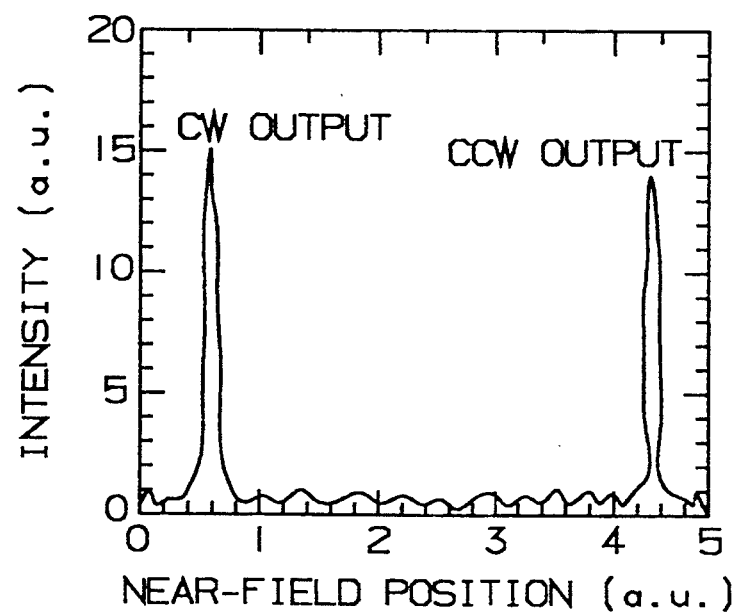
FIG. 3(a) is a graph showing the near-field emission patterns of the ring laser of FIG. 1 with 0 mA S-waveguide bias current.
FIG. 3(b) is a graph showing the near-field emission pattern of the ring laser of FIG. 1 with 40 mA S-waveguide bias current.
Figure 3:
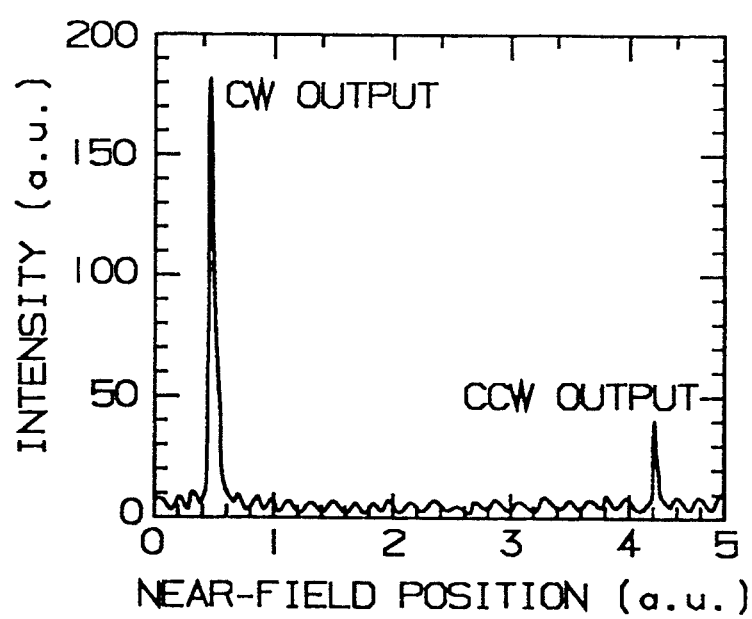

To further characterize the operation of this first embodiment of our unidirectional ring diode laser, we measured the near-field emission patterns from the clockwise and counterclockwise ring outputs. For these measurements, we imaged the cleaved end-facet termination of the ting output waveguides onto a Si charge-coupled-device (CCD) television camera with suitable optical attenuation ($10^4$) to reduce the lasing intensity to prevent saturation of the CCD camera. FIG. 3 shows the results of a line scan of the CCD camera output. In FIG. 3a, the device operating at a continuous-wave current of 70 mA (below the threshold current of 87 mA) with no bias current to the S-waveguide shows a nearly equal output from both ring directions. This ring output in FIG. 3a provides a measure of the non-lasing spontaneous emission level. In FIG. 3b, with the ring diode current increased to 150 mA and the S-waveguide forward biased at 40 mA current, the unidirectional lasing is clearly evident in the preferred clockwise ring direction. In the unsupported counterclockwise ring direction, the output intensity has increased two-fold from the non-lasing spontaneous emission background. However, in the preferred clockwise ring direction, the lasing has increased ten-fold.

Figure 4:
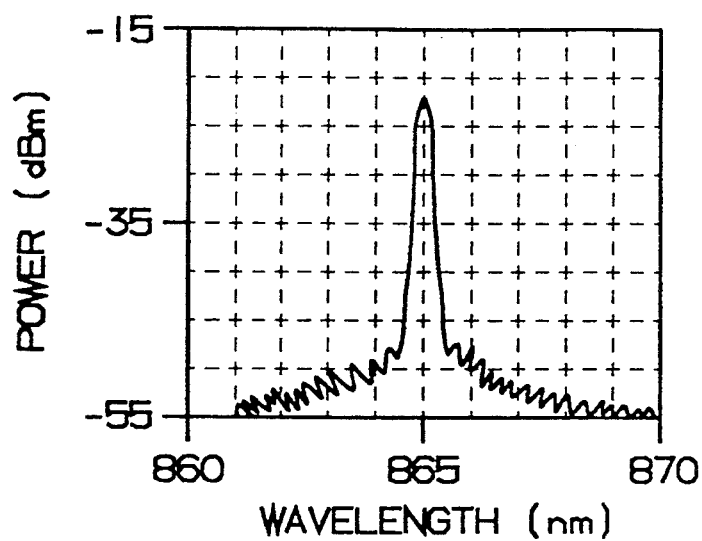
FIG. 4(a) is a graph showing emission spectra of the CW output of the ring laser of FIG. 1 with 0 mA bias current in the S-waveguide.
FIG. 4(b) is a graph showing emission spectra of the CCW output of the ring laser of FIG. 1 with 0 mA bias current in the S-waveguide.
Figure 4:
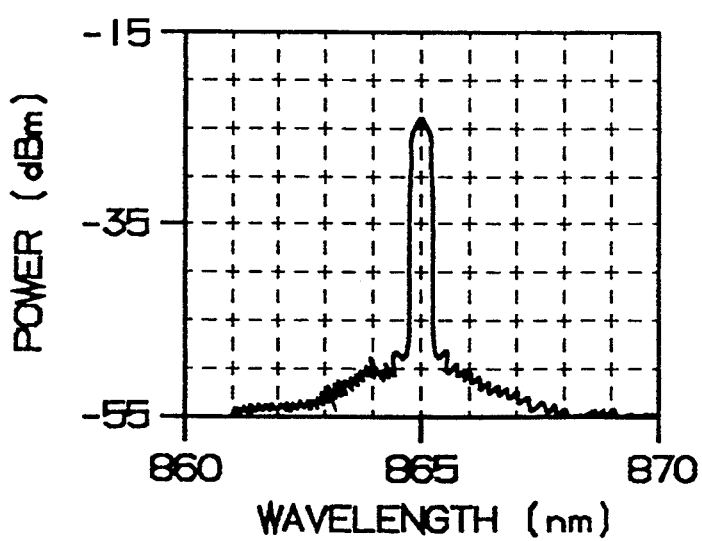
Figure 5:
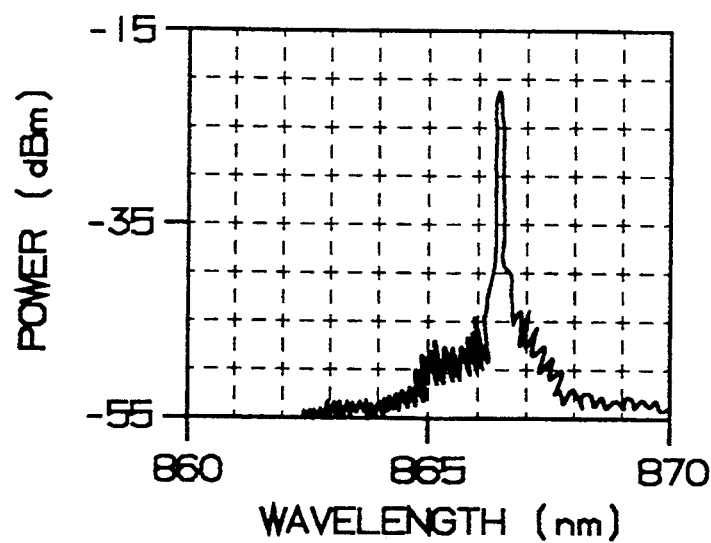
FIG. 5(a) is a graph showing emission spectra of the CW output of the ring laser of FIG. 1 with 40 mA bias current in the S-waveguide.
FIG. 5(b) is a graph showing emission spectra of the CCW output of the ring laser of FIG. 1 with 40 mA in the S-waveguide.
Figure 5:
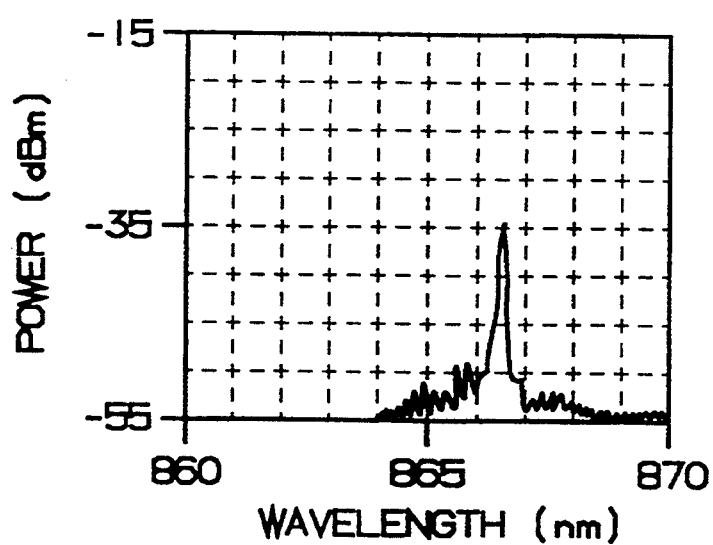

A final measure of the performance of this first embodiment of the invention was obtained from measurements of the emission spectrum with an optical-fiber-input spectrometer (Anritzu, Model MS9001B1). This spectral measurement allows the lasing output to be distinguished apart from the non-lasing spontaneous emission background. FIGS. 4 and 5 show emission spectra for the clockwise and counterclockwise ring outputs with the device operating continuous-wave at 150 mA current. In FIG. 4 the forward bias current to the S-waveguide is 0 mA; and in FIG. 5 it is 40 mA. (For these measurements, the integrated waveguide photodetectors were open circuit.) To obtain these spectra for the clockwise and counterclockwise outputs separately, a bare optical fiber (50 microns core diameter) was placed in close proximity to the cleaved endfacet termination of one the ring diode laser output waveguides. Emission spectra were then recorded at 5 mA intervals in the S-waveguide forward bias current for the clockwise ring output. The optical fiber was then repositioned at the counterclockwise ring output and the measurements repeated.

FIGS. 4a and 4b show the emission spectra from the two ring outputs with 0 mA bias current to the S-waveguide. Here, the ring is lasing single-frequency at the same wavelength (865 nm) in both directions, with about two-thirds of the total single-frequency power in the clockwise output. (The clockwise single-frequency power in FIG. 4a is lower than expected from FIG. 2b, indicating a possible slight misalignment of the optical fiber for the clockwise emission measurement.)

FIGS. 5a and 5b show the emission spectra from the two ring outputs with the S-waveguide forward biased at 40 mA current. The resonance interaction from phase matching of the injected light from the S-waveguide in the ring cavity appears in the spectra in FIG. 5 as a periodic modulation of the non-lasing spontaneous emission ring modes (about 1 nm period). In FIG. 5a, the single-frequency lasing from the clockwise ring output is shifted to longer wavelengths by 1.4 nm by this resonance interaction. The single-frequency power in the clockwise ring output is not significantly increased, possibly the result of inefficient mode matching of the injected light. On the other hand, the single-frequency power in the counterclockwise ring direction in FIG. 5b is reduced by an order of magnitude from its previous value (see FIG. 4b) as a result of gain competition in the ring cavity which favors operation in the clockwise direction.

Figure 6:
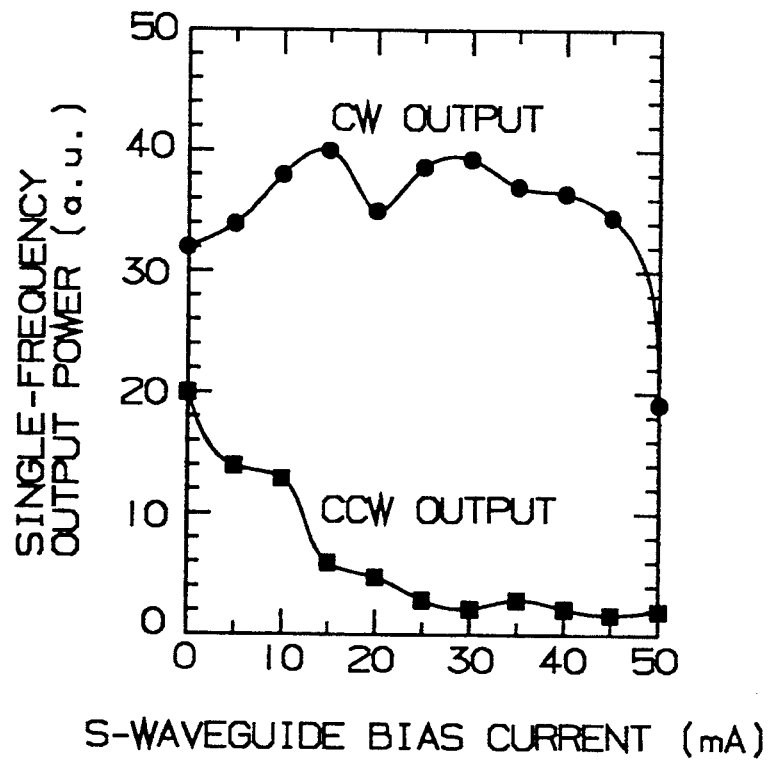
FIG. 6(a) is a graph of single frequency output power of the ring laser of FIG. 1 as a function of S-waveguide bias current.
FIG. 6(b) is a graph of the percentage of total lasing power emitted in the preferred CW direction as a function of bias current in the S-waveguide.
Figure 6:
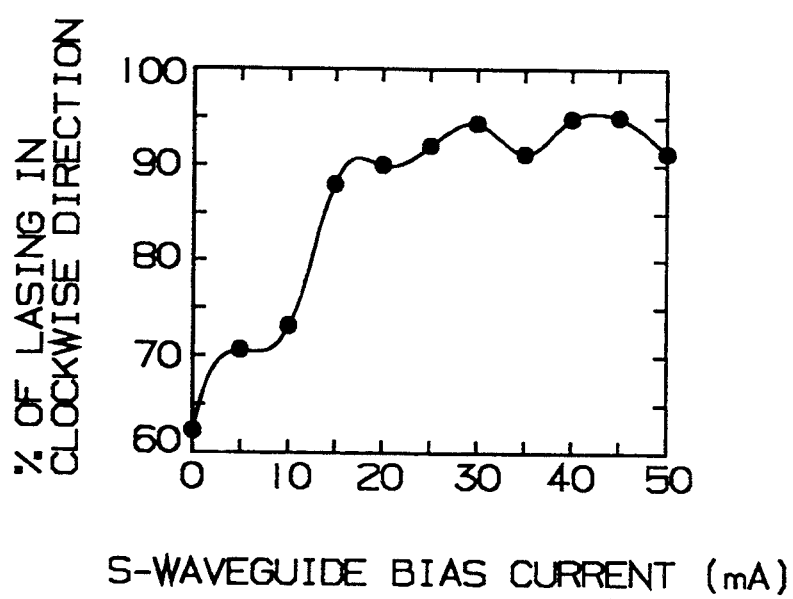

The above emission data were used to characterize the behavior of the single-frequency output power as a function of the forward bias current applied to the crossover S-waveguide and to determine the percentage of the total single-frequency output power which was emitted in the preferred (clockwise) ring direction. These results are presented in FIG. 6. In FIG. 6a, the single-frequency power from the clockwise and counterclockwise ring outputs is plotted as a function of the forward bias current to the S-waveguide. FIG. 6a shows that the clockwise ring output power increases initially by about 25% as the S-waveguide bias current is increased to 15 mA. This is due to the amplification and injection of the lasing back into the ring in phase with the clockwise propagating lasing ring mode. As the bias current is further increased, the phase of the injected lasing is shifted so that it is out of phase with the ring lasing. This results in a reduction in the clockwise output with a minimum at 20 mA bias current. Further increasing the S-waveguide bias current shifts the injected lasing back in phase with the ring lasing and the clockwise output again increases.

The single-frequency power from the counterclockwise ring output in FIG. 6a is affected quite differently by the S-waveguide bias current. This output drops very dramatically as the bias current is increased. This is due to the strong coupling between the two counterpropagating ring lasing modes in the semiconductor gain medium. Any increase in the clockwise lasing power reduces the counterclockwise lasing power as a result of this gain competition. As a result, the single-frequency power from the counterclockwise ring output at 50 mA S-waveguide bias current is only about one-tenth its value at 0 mA bias current.

In FIG. 6b, the emission data have been replotted to show the percentage of the total single-frequency output power which is emitted from the preferred (clockwise) ring direction. This percentage increases with the forward bias current to the S-waveguide, reaching a value of 95% at 45 mA bias current corresponding to a ratio of 19:1 for the clockwise/counterclockwise ring output power. FIG. 6b also shows the periodic modulation (about 15 mA period in the S-waveguide bias current) due to phase matching of the injected lasing in the ring cavity.

We have also demonstrated additional embodiments of unidirectional ring diode lasers based on the use of nonreciprocal attenuation and gain mechanisms as discussed above. FIGS. 7a and 7b show two embodiments of the invention which are based on racetrack ring laser cavities with crossover S-waveguides. These additional embodiments of the invention have the same GaAs/AlGaAs single-quantum-well GRIN-SCH p-n heterostructure semiconductor gain medium and fabrication method, although it is understood that other epitaxial semiconductor layer structures, other semiconductor material systems, and other fabrication methods as discussed above for the first embodiment of the invention would be equally applicable to these additional embodiments.

In FIG. 7a, a schematic drawing of the second embodiment of the invention is shown. This second embodiment differs from the first embodiment in FIG. 1 only in the geometry of the ring cavity. Here, a racetrack cavity is used since it has the added advantage of reducing the bend loss of the crossover S-waveguide 40 (this bend loss decreases exponentially with increased bend radius). In this second embodiment of the invention, the bend loss of the ring 42 and S-waveguide 40 are identical. This allows greater amplification of the injected lasing in the S-waveguide. It also allows the gain of the S-waveguide to be matched with that of the ring cavity so that a common electrical contact metallization can be used for both if preferred.

FIG. 7b shows a schematic drawing of the third embodiment of the invention. Here, the racetrack ring cavity has been extended by lengthening the linear waveguide sections 44 of the cavity. This lengthening of the ring cavity also allows the incorporation of a linear waveguide section 45 in the crossover S-waveguide to reduce the propagation loss. In addition, this embodiment of the invention teaches that the output branching waveguide Y-junctions 46 and 47 can be located on the linear waveguide sections of the racetrack ring cavity rather than on the curved waveguides as in FIG. 7a.

Figure 8:
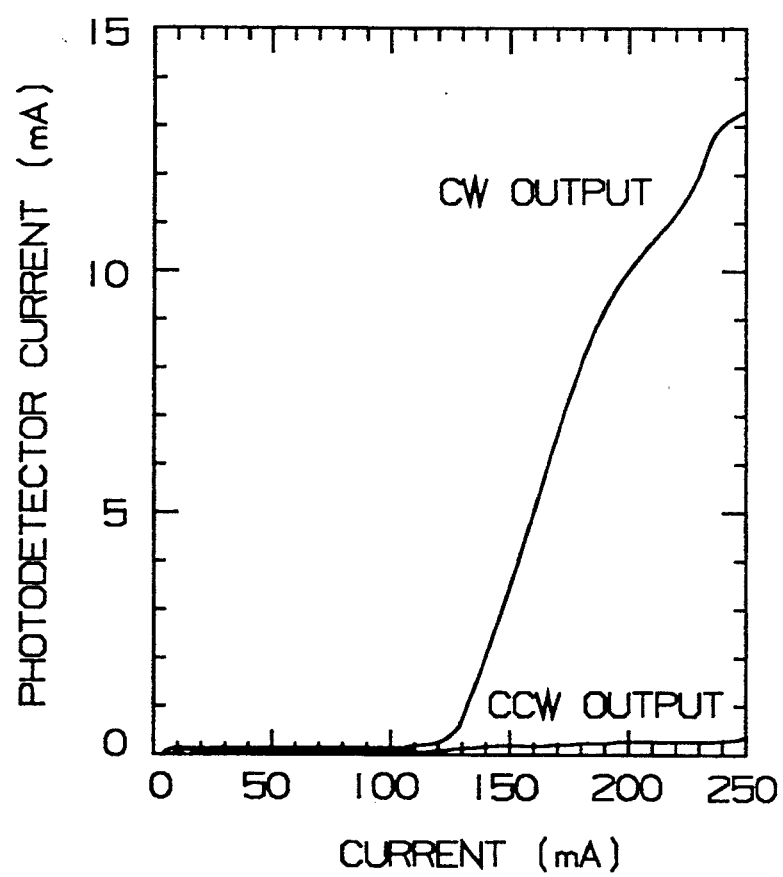
FIG. 8(a) is a graph showing continuous wave light vs. current curve of the device of FIG. 7(a) with the S-waveguide biased at 50 mA.
FIG. 8(b) is a graph showing the near field emission pattern of the device of FIG. 7(a) at a current of 150 mA and the S-waveguide biased at 55 mA.
Figure 8:
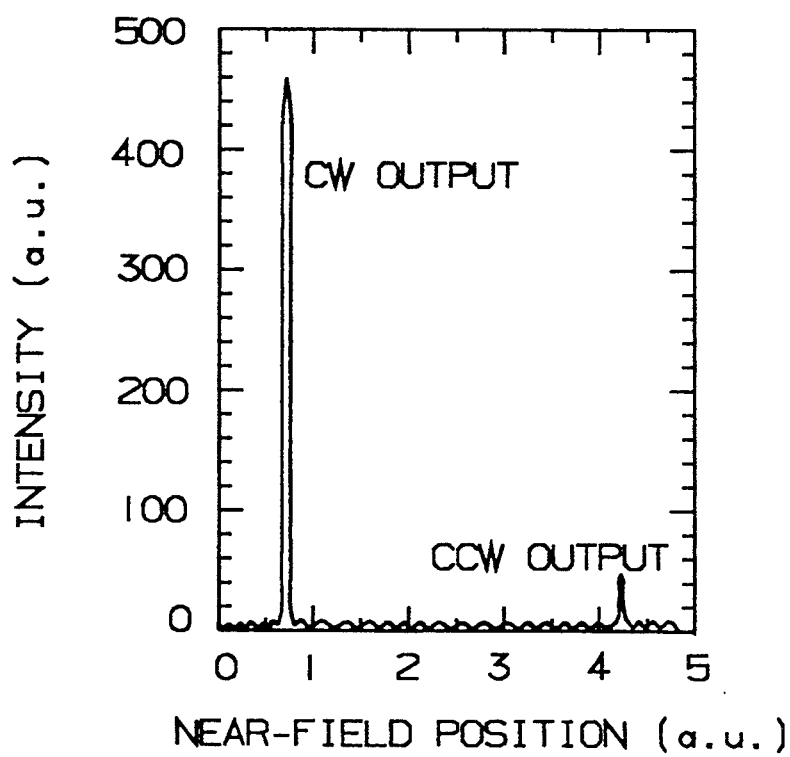

FIG. 8 shows some of the experimental results obtained for the second embodiment of the invention. For this second embodiment, the radius of curvature for the curved waveguides in the ring cavity and crossover S-waveguide was 150 microns and the waveguide width was 6 microns. The equal-width linear waveguides on either side of the ring cavity were 300 microns long. The continuous-wave threshold current for this device at 20° C. was 132 mA (1000 A/cm$^2$). FIG. 8a shows the light-vs-current curves recorded for this device (50 mA S-waveguide bias current) with the integrated waveguide photodetectors (−4.0 V bias). This second device shows unidirectional lasing in the preferred clockwise ring direction with a ratio of clockwise/counterclockwise lasing of 26:1 corresponding to 96% of the lasing output in the preferred clockwise ring direction. FIG. 8b shows the near-field emission pattern for this device measured with the CCD camera with the ring current at 150 mA and the S-waveguide bias current at 55 mA. This measurement again shows that 96% of the lasing output is in the clockwise ring direction.

Figure 9:
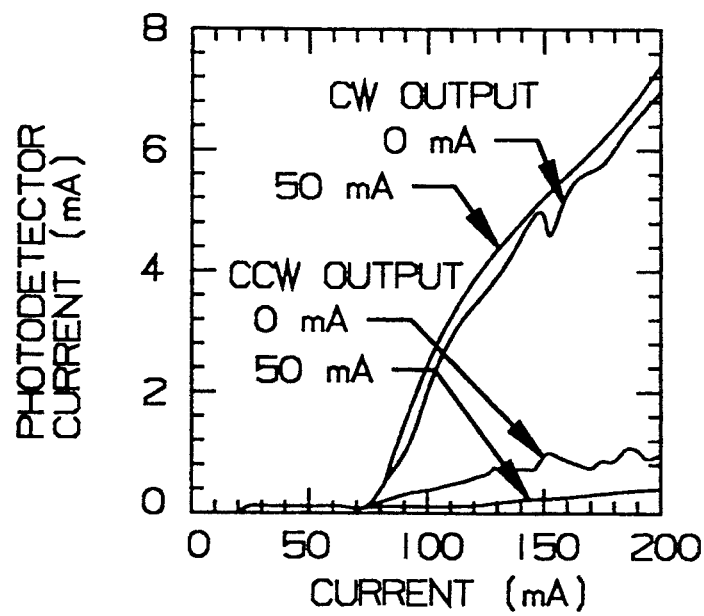
FIG. 9(a) is a graph showing the continuous wave light vs. current curve of the device of FIG. 7(b) with the S-waveguide biased at 0 and 50 mA current.
FIG. 9(b) is a graph showing the near field emission pattern of the device of FIG. 7(b) at 150 mA current with the S-waveguide biased at 30 mA.
Figure 9:
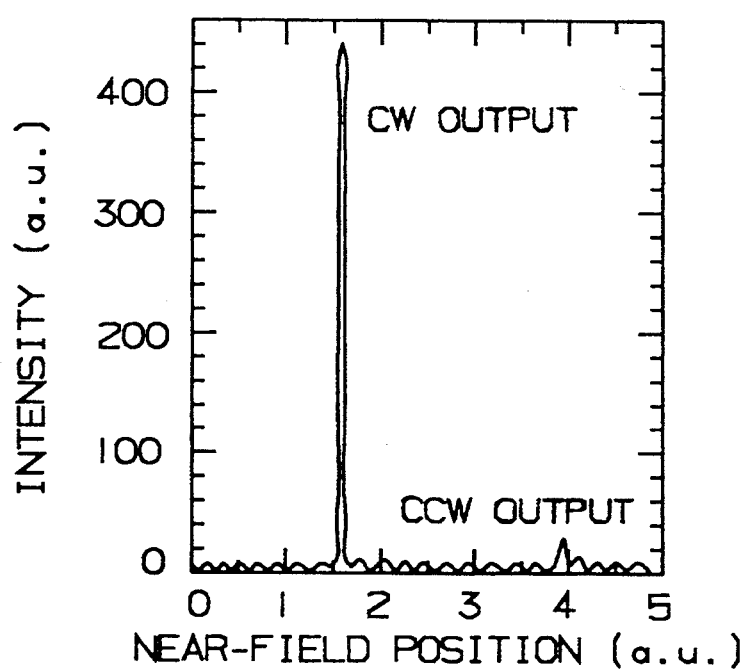

The experimental results for the third embodiment of the invention are presented in FIG. 9. This device was of a smaller size with the curved waveguides having a radius of 100 microns and a width of 6 microns. The equal-width linear waveguide sections used to form the racetrack ring cavity had a length of 250 microns; and an equal-width linear waveguide section of 140 microns was used in forming the crossover S-waveguide. The continuous-wave threshold current for this device at 20° C. was 75 mA (950 A/cm$^2$).

FIG. 9a shows the light-vs-current curves recorded for this third device with the S-waveguide biased at 0 and 50 mA current. For 0 mA S-waveguide bias current, unidirectional operation is evident from the much larger output in the preferred clockwise ring direction (the clockwise/counterclockwise ratio at 200 mA ring current is 7:1). Increasing the S-waveguide bias current to 50 mA further increases the unidirectionality of the device (the clockwise/counterclockwise ratio at 200 mA ring current increases to 20:1) and also eliminates the kinks in the light-vs-current curve. FIG. 9b shows a near-field emission pattern for this device recorded with the CCD camera. This emission pattern shows the unidirectionality of the device with 95% of the lasing output emitted in the preferred clockwise ring direction.

FIG. 10 shows a schematic drawing of the fourth embodiment of the invention. This embodiment is in the form of a circular ring cavity with two flared waveguide sections 50 on the top and bottom of the ring cavity in FIG. 10. These flared waveguide sections are formed by linearly increasing the radius of the outer sidewall of the ring waveguide with position around the ring. These flared waveguide regions generate a nonreciprocal attenuation mechanism in the ring cavity in the counterclockwise ring direction; while the etched-facet mirrors 52 at the termination of the flared waveguides act to generate a nonreciprocal gain mechanism in the preferred clockwise ring direction. The flared waveguide sections which are terminated by an etched-facet back-reflecting mirror 52 will act to limit the number of modes which can lase in the counterclockwise ring direction with any modes impinging on the etched-facet mirrors being reflected back to inject the lasing in the counterpropagating (clockwise) ring direction. The lasing in the clockwise ring direction will experience a much smaller attenuation upon entering the flared waveguide section and will not encounter the etched-facet back-reflecting mirrors. As a result, this fourth embodiment of the invention should operate unidirectionally without any crossover waveguide. In FIG. 10, the ring radius is shown as 150 microns and the waveguide width is 6 microns in the unflared waveguides and increases to 12 microns in the flared waveguides. These dimensions are illustrative only and other dimensions can be used as known in the art. In addition, either or both sidewalls of the ring cavity can be flared as will become evident to those skilled in the art.

Figure 11:
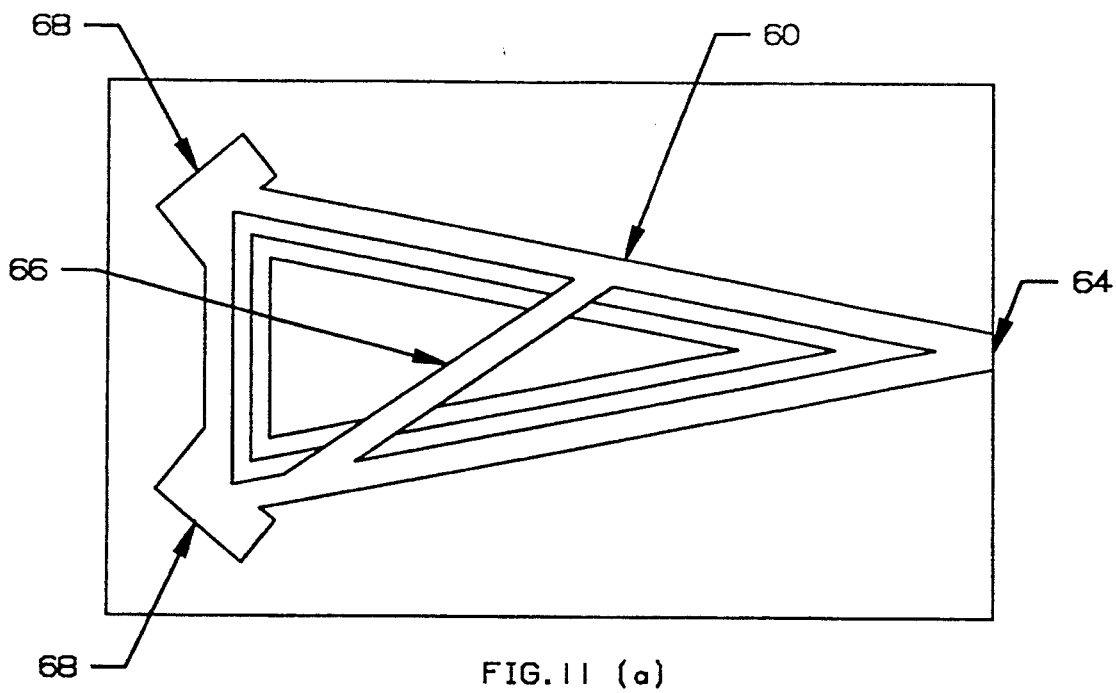
FIG. 11(a) is a fifth embodiment of the invention shown in plan view as a triangular ring laser with a partially transmitting output mirror and a linear crossover waveguide.
FIG. 11(b) is a sixth embodiment of the invention shown in plan view as a parallelogram ring laser with two partially transmitting output mirrors and a linear crossover waveguide.
Figure 11:
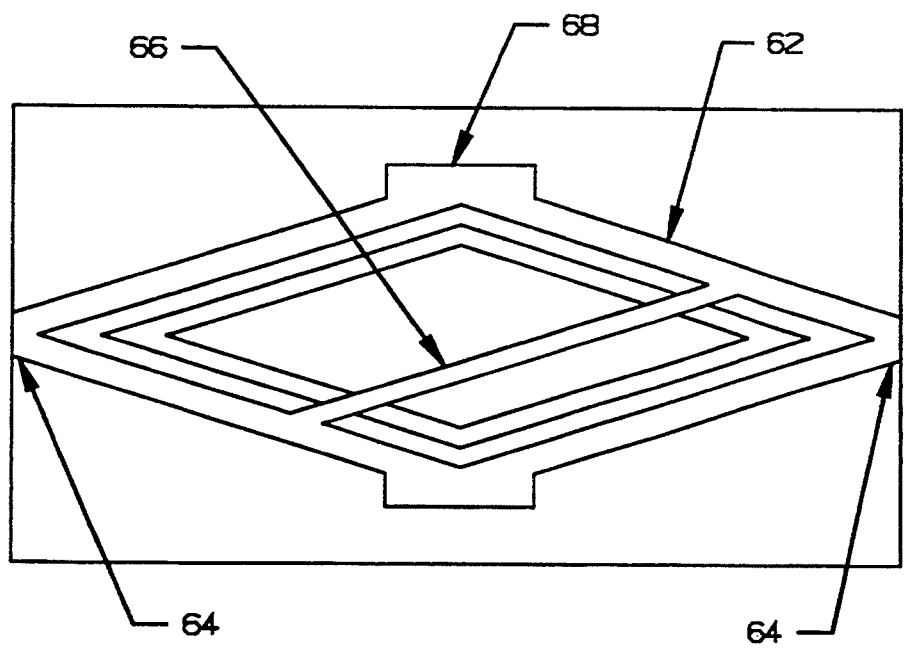

The teaching of this invention can also be applied to polygonal ring cavities formed from linear waveguide segments with etched, cleaved, or otherwise formed partially or totally reflecting mirrors. Unidirectional lasing in such polygonal ring cavities may be obtained using the nonreciprocal attenuation and gain mechanisms as set forth in this invention. The nonreciprocal attenuation can be generated by means of branching waveguide Y-junctions, flared waveguides, partially reflecting mirrors, or by other means as will become evident to those skilled in the art. The nonreciprocal attenuation can be used separately or in conjunction with a nonreciprocal gain which can be generated by the use of one or more crossover waveguides or integral mirrors. The crossover waveguides may be formed by one or more linear or curved waveguide sections with turning mirrors or branching waveguide Y-junctions as required appropriate to the geometry of the polygonal ring cavity. FIGS. 11a and 11b show how these crossover waveguides 66 might be constructed for triangular 60 and parallelogram 62 ring cavities with partially transmitting output mirrors. The vertices of the polygonal resonant cavities are either the partially transmitting output mirrors 64 or etched facet mirrors 68 as shown.

Figure 12:
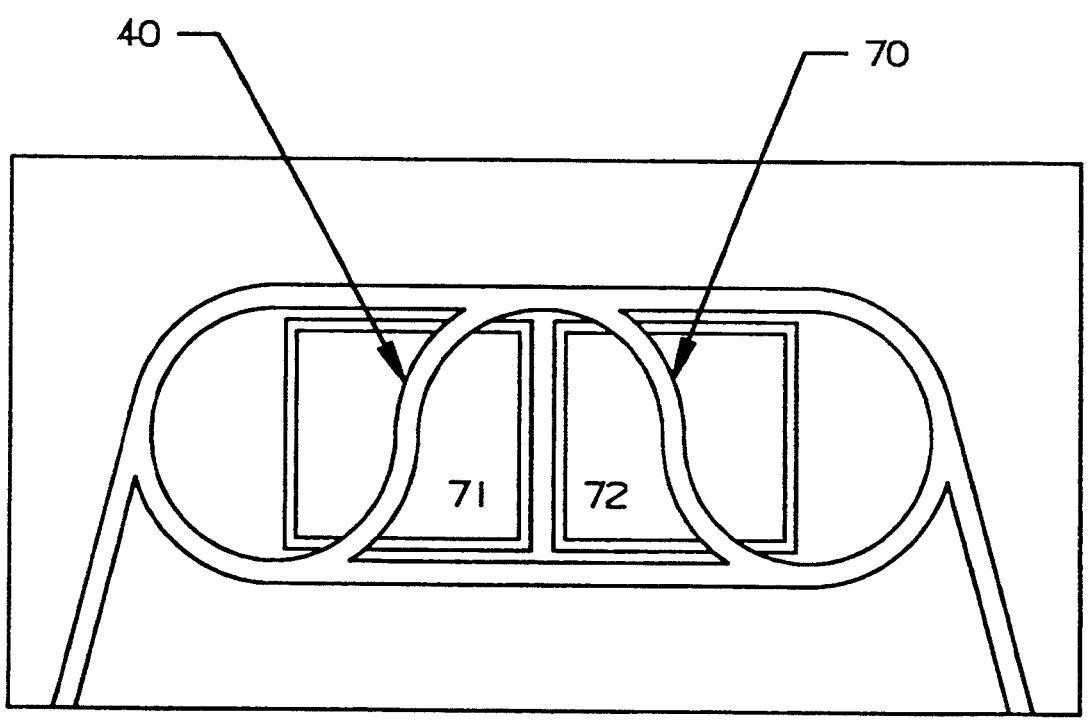
FIG. 12 is a seventh embodiment of the invention shown in plan view as a variation of the racetrack configuration in FIG. 7(a) but with the addition of a second oppositely arrayed S-waveguide to produce an electrically switchable unidirectional ring laser.

Although the discussion heretofore has been limited to a single independently-contacted crossover waveguide, we also envision the use of multiple independently-contacted crossover waveguides for applications in which the direction of propagation of the ring lasing must be switched. Examples of such applications include but are not limited to the use of unidirectional ring diode lasers for optical logic and computing. Previously, such optical logic applications with polygonal ring diode lasers have required the use of external optical control (injection locking) to accomplish a switching of the lasing direction in the ring cavity. In our invention the control mechanism for switching the direction of lasing in the ring diode laser is built into the device structure in the form of multiple independently-contacted crossover waveguides and the switching is performed electrically by controlling the bias current to the appropriate crossover waveguide. An example of a possible embodiment of the invention for optical logic and switching applications is shown in FIG. 12. The device in FIG. 12 is based on the racetrack ring diode laser cavity in FIG. 7a which has been extended to allow the addition of a second independently-contacted crossover waveguide 70. The direction of preferred lasing in this ring cavity is controlled by the application of an electrical forward bias current to one of the crossover waveguides. With the bias current applied by independent electrical contact 71 to crossover waveguide 40, unidirectional lasing occurs in the clockwise ring direction. With the bias current applied by independent electrical contact 72 to crossover waveguide 70, the unidirectional lasing direction is reversed (counterclockwise). Although the two crossover waveguides 40 and 70 are shown spatially separated in FIG. 12, they may be crossed to make the ring cavity more compact. In this case, only a portion of the extent of each crossover waveguide may be independently contacted if desired with the remainder sharing a common metallization with the semiconductor ring diode laser. (The crossover waveguides in the 'off' state may be reverse biased if desired to ensure that no lasing is propagated through them.)

Additional output waveguides may be added to the ring cavity to generate multiple optical inputs and outputs for optical logic applications. In this mode of usage, the ring laser cavity can act to amplify and route optical signals from one or more inputs to one or more outputs. Since there are no etched-facet mirrors on this device it may be direct coupled to other optical waveguides in the form of a photonic optical circuit. Additional applications and embodiments of the present invention will become evident to those skilled in the art. By way of explanation for the language in the appended claims, the Y-junctions discussed above are described below as a separate waveguide intersecting the waveguide forming the resonant cavity at an acute angle. If light is to enter the Y-junction from the bottom of the Y, it will enter either of the upper two arms of the Y with relatively equal ease. However, if the light enters the junction from one of the upper arms, it will only go out the bottom of the Y and not into the other upper arm. In the claims, one of these two upper arms is the acutely intersecting waveguide while the bottom of the Y and the other upper arm is the waveguide of the resonant cavity.

What is claimed is:

1. A unidirectional ring laser comprising:
  a closed loop resonant cavity, at least a section of which exhibits optical gain to produce lasing action;
  optical waveguide means integrated with the closed loop resonant cavity to control the direction of the light travelling within the cavity including means to selectively couple light out of the resonant cavity in a non-preferred direction and means to selectively couple light into the resonant cavity in a preferred direction; and
  means to transmit light out of the cavity.

2. The ring laser of claim 1 wherein the ring laser is monolithically integrated onto a substrate.

3. The ring laser of claim 1 wherein the closed loop resonant cavity comprises doped optical fiber and the means to control the direction of light is a crossover waveguide comprising optical fiber which joins the resonant cavity at two points by means of fiber splitters.

4. The ring laser of claim 1 wherein the closed loop resonant cavity comprises a solid state lasing medium deposited atop a substrate and the means to control the direction of light comprises an optical waveguide atop the substrate which joins the resonant cavity at two points.

5. A unidirectional semiconductor ring laser comprising:
  a substrate; and
  active waveguide means formed on the substrate comprising;
    a closed loop resonant cavity portion, at least a section of which exhibits optical gain for lasing action;
    means integrated with the closed loop resonant cavity portion to control the direction of the light traveling within the cavity including means to selectively couple light out of the resonant cavity in a non-preferred direction and means to selectively couple light into the resonant cavity in a preferred direction; and
  means to transmit light out of the cavity.

6. The ring laser of claim 5 wherein the active waveguide means is contained within the vertical layers of a structure formed on the substrate comprising:
  a lower semiconductor cladding layer located above said substrate;
  an active lasing layer above said lower semiconductor cladding layer;
  an upper cladding layer located above said active lasing layer;
  an upper contact metallization layer located above said upper cladding layer;
    said lower and upper cladding layers and said active lasing layer forming a diode lasing structure having a p-n heterojunction.

7. The laser of claim 5 wherein the means to control the direction of the light comprise optical elements which produce a nonreciprocal attenuation of light travelling in the nonpreferred direction within the cavity.

8. The laser of claim 5 wherein the means to control the direction of the light comprise optical elements which produce a nonreciprocal amplification of light traveling in the preferred direction within the cavity.

9. The laser of claim 5 wherein the means to control the direction of the light comprise optical elements which produce a nonreciprocal amplification of light traveling in the preferred direction within the cavity and other optical elements which produce an nonreciprocal attenuation of light traveling in the nonpreferred direction within the cavity.

10. The laser of claim 5 wherein the resonant cavity is circular.

11. The laser of claim 5 wherein the resonant cavity is in the shape of a racetrack.

12. The laser of claim 5 wherein the resonant cavity is in the shape of a polygon formed by linear waveguides and mirror means at the intersections of the waveguides.

13. The laser of claim 5 wherein the means to selectively couple light comprise partially transmitting mirror means intercepting at least a portion of the light travelling in the resonant cavity.

14. The laser of claim 7 wherein the nonreciprocal attenuation element comprises an acutely intersecting waveguide disposed to couple light traveling in the nonpreferred direction out of the resonant cavity.

15. The laser of claim 8 wherein the nonreciprocal amplification element comprises a crossover waveguide connecting two points on the resonant cavity.

16. The laser of claim 15 wherein the crossover waveguide is an active waveguide.

17. The laser of claim 15 wherein the ends of the crossover waveguide intersect the resonant cavity in acute angles disposed to couple light traveling in the nonpreferred direction out of the resonant cavity and into the crossover waveguide and to couple light traveling in the preferred direction out of the crossover waveguide and into the resonant cavity.

18. The laser of claim 17 wherein the crossover waveguide is an active waveguide.

19. The laser of claim 18 wherein the laser further comprises a second crossover waveguide oppositely disposed with respect to the first crossover waveguide and means to separately electrically activate said first and second crossover waveguides to form a reversible unidirectional ring laser.

20. The laser of claim 7 wherein the optical elements producing the nonreciprocal attenuation comprises at least one flared section of the resonant cavity of gradually increasing width which terminates in a mirror means of a width equal to the increased width of the waveguide, said mirror means disposed to reflect light traveling in the nonpreferred direction within the cavity back into the cavity in the preferred direction.

21. A unidirectional semiconductor ring laser comprising:
  a substrate; and
  active waveguide means formed on the substrate comprising;
    a closed loop resonant cavity portion, at least a section of which exhibits lasing action;
    at least one output waveguide connected to the closed loop portion at an acute angle;
    a crossover waveguide connected at its ends to the inside of the closed loop portion in acute angles to couple light traveling in the nonpreferred direction out of the resonant cavity and into the crossover waveguide and to couple light traveling in the preferred direction out of the crossover waveguide and into the resonant cavity.

22. The ring laser of claim 21 wherein the closed loop resonant cavity portion is in the shape of a circular ring formed by one or more curved optical waveguides.

23. The ring laser of claim 21 wherein the closed loop resonant cavity portion is formed by two semicircular optical waveguides connected by means of two interposed linear optical waveguides.

24. The ring laser of claim 21 wherein the crossover waveguide is a passive optical waveguide.

25. The ring laser of claim 21 wherein the crossover waveguide comprises an active optical waveguide means with a diode lasing structure having a p-n heterojunction for the purpose of amplifying the lasing action therein.

26. The ring laser of claim 21 wherein the lasing section of the optical waveguide means has a separate electrical contact for the purpose of controlling a characteristic of the lasing action therein.

27. The ring laser of claim 21 wherein the at least one output waveguide comprises at least two output waveguides, at least one of which couples light out of the resonant cavity traveling in the preferred direction and at least another of which couples light out of the resonant cavity traveling in the nonpreferred direction.

28. The ring laser of claim 21 further comprising a second crossover waveguide oppositely disposed with respect to the first crossover waveguide and means to separately electrically activate said first and second crossover waveguides to form a reversible unidirectional ring laser.

* * * * *